(12) United States Patent
Akaogi

(10) Patent No.: US 7,126,862 B2
(45) Date of Patent: Oct. 24, 2006

(54) DECODER FOR MEMORY DEVICE

(75) Inventor: Takao Akaogi, Cupertino, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/076,252

(22) Filed: Mar. 8, 2005

(65) Prior Publication Data
US 2006/0203598 A1   Sep. 14, 2006

(51) Int. Cl.
| | |
|---|---|
| G11C 16/06 | (2006.01) |
| G11C 16/08 | (2006.01) |
| G11C 11/24 | (2006.01) |
| G11C 8/00  | (2006.01) |
| G11C 8/08  | (2006.01) |
| G11C 8/10  | (2006.01) |

(52) U.S. Cl. ............... 365/189.11; 365/230.06; 365/149; 365/185.23; 327/106

(58) Field of Classification Search .......... 365/189.09, 365/230.06, 226, 189.11, 149, 185.23, 185.25; 326/106, 98; 327/105, 106, 107, 108
See application file for complete search history.

(56) References Cited

U.S. PATENT DOCUMENTS

| | | | | | |
|---|---|---|---|---|---|
| 4,455,629 A | * | 6/1984 | Suzuki et al. | ......... | 365/230.06 |
| 5,404,329 A | * | 4/1995 | Yamagata et al. | ..... | 365/189.09 |
| 5,467,032 A | * | 11/1995 | Lee | ............. | 326/88 |
| 5,923,596 A | * | 7/1999 | Wu et al. | ............. | 365/189.09 |
| 6,085,800 A | * | 7/2000 | Usui | ............. | 138/142 |
| 6,137,733 A | * | 10/2000 | Watanabe | ............. | 365/189.09 |
| 6,421,295 B1 | * | 7/2002 | Mao et al. | ............. | 365/230.06 |
| 6,535,430 B1 | * | 3/2003 | Ogura et al. | ........... | 365/185.23 |
| 6,646,950 B1 | | 11/2003 | Akaogi | ............. | 365/230.06 |

* cited by examiner

*Primary Examiner*—Amir Zarabian
*Assistant Examiner*—Michael Weinberg
(74) *Attorney, Agent, or Firm*—Monica H. Choi

(57) ABSTRACT

A decoder for a memory device includes driving devices each applying a respective line voltage to a respective line of the memory device when turned on. The decoder also includes a control device coupled to the plurality of driving devices at a common node for generating a voltage that controls the driving devices to turn on or off. Also, a capacitor coupled to the common node increases the voltage at the common node from an initial boost voltage to a final boost voltage. Thus, a line of a memory device is driven to a boost voltage with minimized area and wiring complexity.

18 Claims, 6 Drawing Sheets

US 7,126,862 B2

DECODER FOR MEMORY DEVICE

TECHNICAL FIELD

The present invention relates generally to memory devices such as flash memory devices for example, and more particularly to a word-line decoder for a memory device with high density driving transistors.

BACKGROUND OF THE INVENTION

FIG. 1 shows a typical flash memory device 100 including blocks of flash memory cells. The elements of one example block 102 include an array of flash memory cells 103. An array of eight by eight flash memory cells is illustrated in the example block 102 for simplicity of illustration and description. However, a typical block would have more numerous flash memory cells.

Each flash memory cell 103 has a control gate, a drain, and a source. The control gates of all flash memory cells in one row are coupled to a same word-line. The drains of all flash memory cells in one column are coupled to a same bit-line. Thus, the example block 102 has the eight word lines WL0, WL1, . . . , and WL7 for the eight rows of flash memory cells. In addition, the example block 102 has eight bit lines coupled to eight select MOSFETs (metal oxide semiconductor field effect transistors) 104.

Furthermore, the example block 102 has a local X-decoder 106 for activating one of the word lines WL0, WL1, . . . , and WL7. For accessing one of the flash memory cells in the block 102, a selected one of the word lines WL0, WL1, . . . , and WL7 is activated when a boost voltage VBST is applied thereon by the local X-decoder. Additionally for accessing that flash memory cell, one of the select MOSFETs 104 coupled to the drain of that flash memory cell is turned on for applying a boost voltage YBST thereon. The sources of the flash memory cells are coupled to a low supply voltage VSS.

Further referring to FIG. 1, the local X-decoder 106 applies the boost voltage VBST on the selected one of the word lines WL0, WL1, . . . , and WL7 using the controls signals PGW and NGW from a global X-decoder 108, WLG from a vertical block decoder 110, and eight word-line voltages AVW0, AVW1, . . . , and AVW7 from a vertical word line decoder 112. The PGW signal indicates whether a flash memory cell within the block 102 is to be accessed for an operation such programming, and NGW is the reverse logical state of PGW. The global X-decoder decodes block row address bits from an address sequencer (not shown) for generating PGW and NGW that are applied across a row of blocks such as 102 and 114 in FIG. 1.

The WLG indicates whether a column of blocks such as blocks 102 and 116 are being accessed. The vertical block decoder 110 decodes vertical block address bits from the address sequencer (not shown) for generating WLG applied across the column of blocks 102 and 116 in FIG. 1.

The vertical word line decoder 112 decodes vertical word line address bits from the address sequencer (not shown) for generating eight word-line voltages AVW0, AVW1, . . . , and AVW7 applied across the column of blocks 102 and 116. In addition, the drain bit line boost voltage YBST is applied on the selected drain bit line across the column of blocks 102 and 116. FIG. 1 shows an array of two by two blocks for the flash memory device 100, but typical flash memory devices typically include more numerous blocks.

FIG. 2 shows an example implementation 106A of the local X-decoder 106 as disclosed in U.S. Pat. No. 6,646,950.

The local X-decoder 106A inputs the control signals PGW, NGW, WLG, AVW0, AVW1, . . . , and AVW7 from the decoders 108, 110, and 112. The local X-decoder 106A then applies a boost voltage VBST on one of the word lines WL0, WL1, . . . , and WL7 when the PGW is a logical high state.

Referring to FIG. 2, the local X-decoder 106A includes a respective driver for each of the word lines WL0, WL1, . . . , and WL7. Thus, a first driver 120 is for the first word line WL0, a second driver 121 is for the second word line WL1, . . . , and so on until an eighth driver 127 is for the eighth word line WL7.

Each driver, such as the first driver 120, includes a driving MOSFET (metal oxide semiconductor field effect transistor) 132 and a pull-down MOSFET 134 coupled in series. The driving MOSFET 132 has a drain coupled to a corresponding line voltage AVW0 from the vertical word line decoder 112. Thus, the driving MOSFET within the second driver 121 is coupled to the corresponding line voltage AVW1, and so on until the driving MOSFET within the eighth driver 127 is coupled to the corresponding line voltage AVW7.

Further in the example driver 120, the source of the driving MOSFET 132 is coupled to a drain of the pull-down MOSFET 134. The source of the pull-down MOSFET 134 is coupled to a low voltage VSS. The control signal NGW from the global X-decoder 108 is coupled to the gate of the pull-down MOSFET 134. The example driver 120 also includes a control MOSFET 136 having a source coupled to the gate of the driving MOSFET 132 at a control node 138.

Further referring to FIG. 2, each of the drivers 120, 121, . . . , and 127 are each implemented similarly with a respective control MOSFET, a respective driving MOSFET, and a respective pull-down MOSFET. The PGW control signal from the global X-decoder 108 is applied on the drains of the control MOSFETs in all of the drivers 120, 121, . . . , and 127. The WLG control signal from the vertical block decoder 110 is applied on the gates of the control MOSFETs in all of the drivers 120, 121, . . . , and 127.

For driving one of the word lines WL0, WL1, . . . , and WL7 to a boost voltage VBST, the controls signals PGW and WLG are set at the boost voltage VBST. Assume that the first word line WL0 is to be activated to the boost voltage VBST. In that case, initially, the AVW0 is set to the low voltage VSS while the control signals PGW and WLG are set to the original boost voltage VBST. With such voltages, an initial boost voltage (VBST−Vth) is generated at the control node 138, with Vth being the threshold voltage of the control MOSFET 136.

Thereafter, with the control signals PGW and WLG still set to the original boost voltage VBST, the AVW0 is set to the original boost voltage VBST such that a final boost voltage (VBST+ΔV) is generated at the control node 138, with ΔV being about the gate to source voltage of the driving MOSFET 132. In this manner, the original boost voltage VBST is generated on the word line WL0 without degradation of the voltage level from the gate to source voltage drop for the driving MOSFET 132 when the AVW0 is set to the original boost voltage. On the other hand, if the AVW0 is the low voltage VSS, then the word line WL0 is discharged to the low voltage VSS.

The respective control MOSFET, the respective driving MOSFET, and the respective pull-down MOSFET within each of the other drivers 121, . . . , and 127 operate similarly. Thus, the corresponding word line WL is activated to the boost voltage VBST if the corresponding line voltage AVW is the boost voltage, or is discharged to the low voltage VSS if the corresponding line voltage AVW is the low voltage VSS, for each of the drivers 120, 121, . . . , and 127.

When the NGW is activated to the boost voltage VBST (with the PGW being deactivated to the low voltage VSS), the driving MOSFETs are turned off, and the pull-down MOSFETs are turned on in all of the drivers 120, 121, . . . , and 127. In that case, each of the word lines WL0, WL1, . . . , and WL7 is discharged to the low voltage VSS.

In the local X-decoder 106A of FIG. 2, each of the drivers 120, 121, . . . , and 127 is implemented with a corresponding control MOSFET 136 for stepping up the control voltage at a respective control node 138 from the initial boost voltage (VBST−Vth) to the final boost voltage (VBST+ΔV) that is higher than the original boost voltage VBST. Thus, eight such control MOSFETs and eight separate such control nodes are used in the eight drivers 120, 121, . . . , and 127 in the prior art of FIG. 2, resulting in increased area and wiring complexity.

SUMMARY OF THE INVENTION

Accordingly, a line of a memory device is activated to a boost voltage with minimized area and wiring complexity in a decoder of the present invention.

In a general aspect of the present invention, a decoder for a memory device includes a plurality of driving devices each applying a respective line voltage to a respective line of the memory device when turned on. Additionally, the decoder includes a control device coupled to the plurality of driving devices at a common node for generating a voltage at the common node for controlling the driving devices to turn on or off.

In another embodiment of the present invention, the decoder includes a capacitor coupled to the common node, and a charge stored in the capacitor increases the voltage at the common node from an initial boost voltage to a final boost voltage.

In an example embodiment of the present invention, the capacitor is a MOSFET (metal oxide semiconductor field effect transistor) having a gate coupled to the common node and having a drain and a source that are coupled together at a capacitance node. In that case, a low voltage is applied on the capacitance node when the initial boost voltage is generated at the common node.

In another embodiment of the present invention, each of the driving devices is a MOSFET having a gate coupled to the common node and having a drain with the respective line voltage applied thereon and having a source coupled to the respective line. The respective line voltage for each of the driving devices is the low voltage when the initial boost voltage is generated at the common node. Then, at least one of the respective line voltages is an original boost voltage that is also applied on the capacitance node for generating the final boost voltage at the common node.

In a further embodiment of the present invention, the control device is a MOSFET having a source coupled to the common node and having a gate and a drain with the original boost voltage applied thereon during generation of the initial boost voltage and the final boost voltage on the common node.

In another embodiment of the present invention, the decoder includes a plurality of pull-down devices, each applying a low voltage to a respective line of the memory device when the driving devices are turned off. For example, each pull-down device is a MOSFET having a source with the low voltage applied thereon, a drain coupled to a respective line, and a gate coupled to a common control terminal. The gates of all the MOSFETs comprising the pull-down devices are coupled to the common control terminal. In another mode of operation, the original boost voltage is applied on the common control terminal for turning on all the MOSFETs comprising the pull-down devices such that the low voltage is applied on each respective line.

The present invention may be practiced to particular advantage when the decoder is a local X-decoder for the memory device that is a flash memory device, and when each respective line is a respective word line of the flash memory device. However, the present invention may be used for any type of decoder within any type of memory device.

In this manner, the driving MOSETs are controlled by one control MOSFET that adjusts the voltage at one common node in the decoder of the present invention. Thus, the area and wiring complexity is minimized with the decoder of the present invention.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, and 6 refer to elements having similar structure and function.

DETAILED DESCRIPTION

Figure 1:
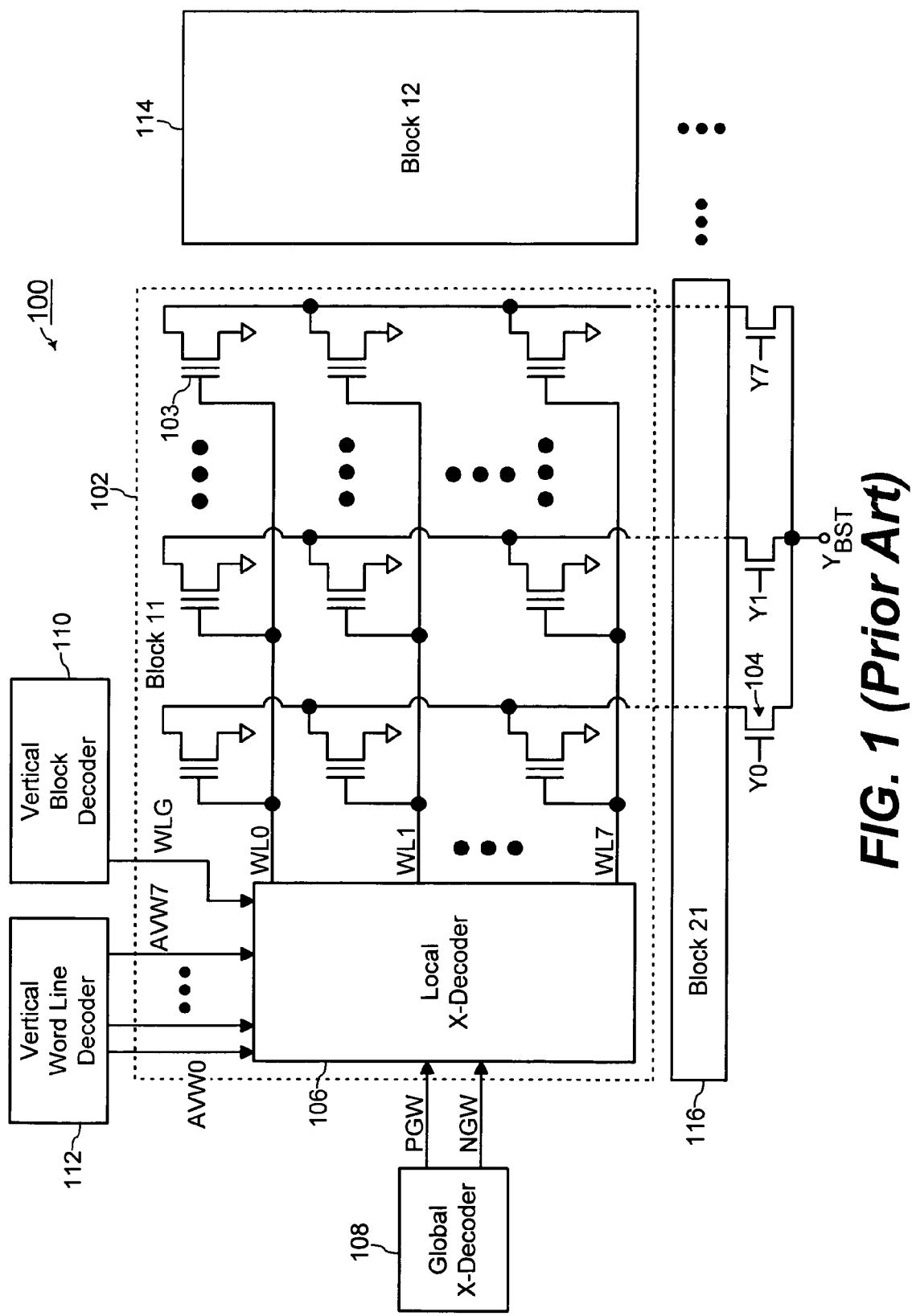
FIG. 1 shows basic elements of a flash memory device including a local X-decoder for driving word lines, according to the prior art.
Figure 2:
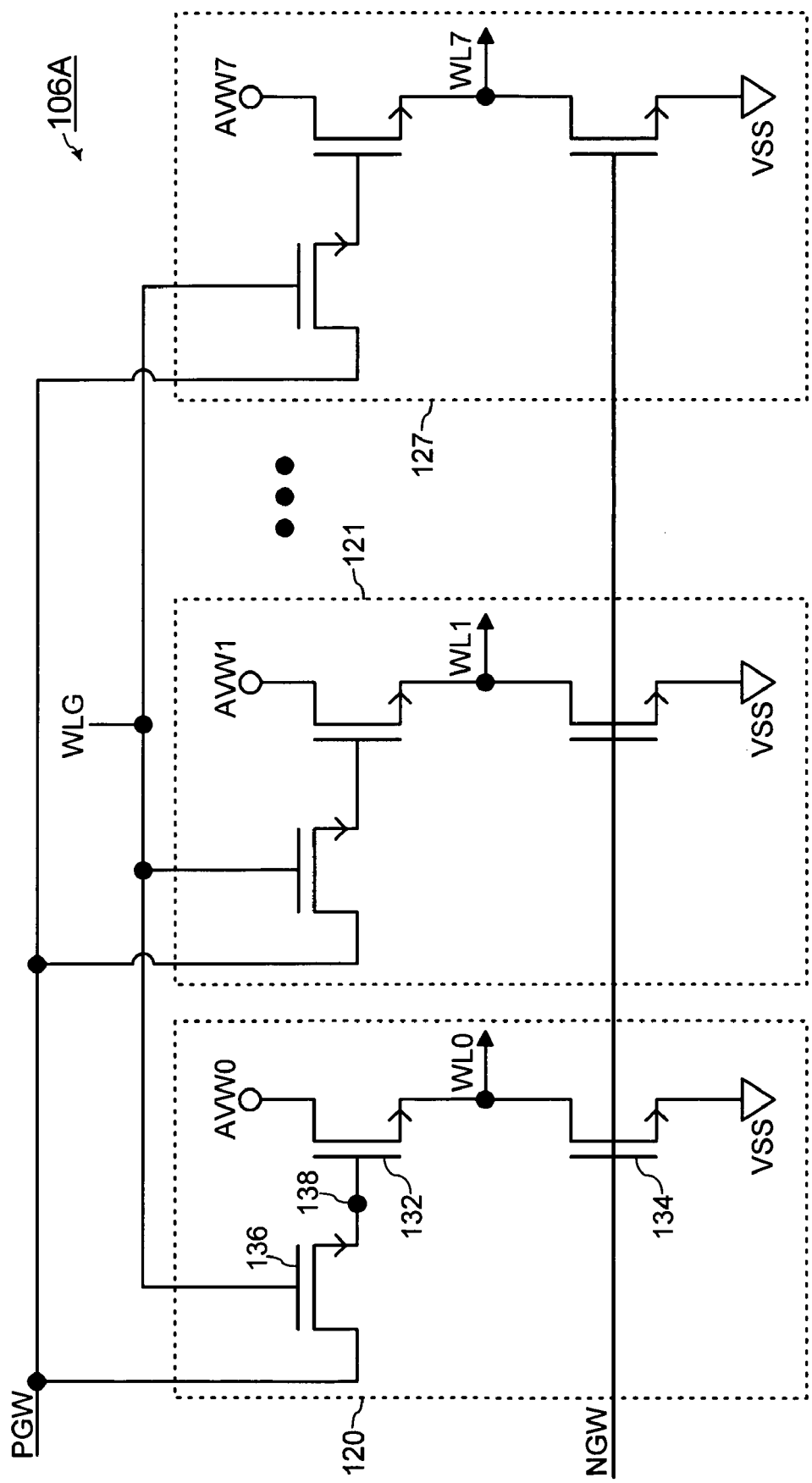
FIG. 2 shows a circuit diagram of an example local X-decoder with a respective control MOSFET coupled to a respective driving MOSFET for each word line resulting in high area and wiring complexity, according to the prior art.
Figure 3:
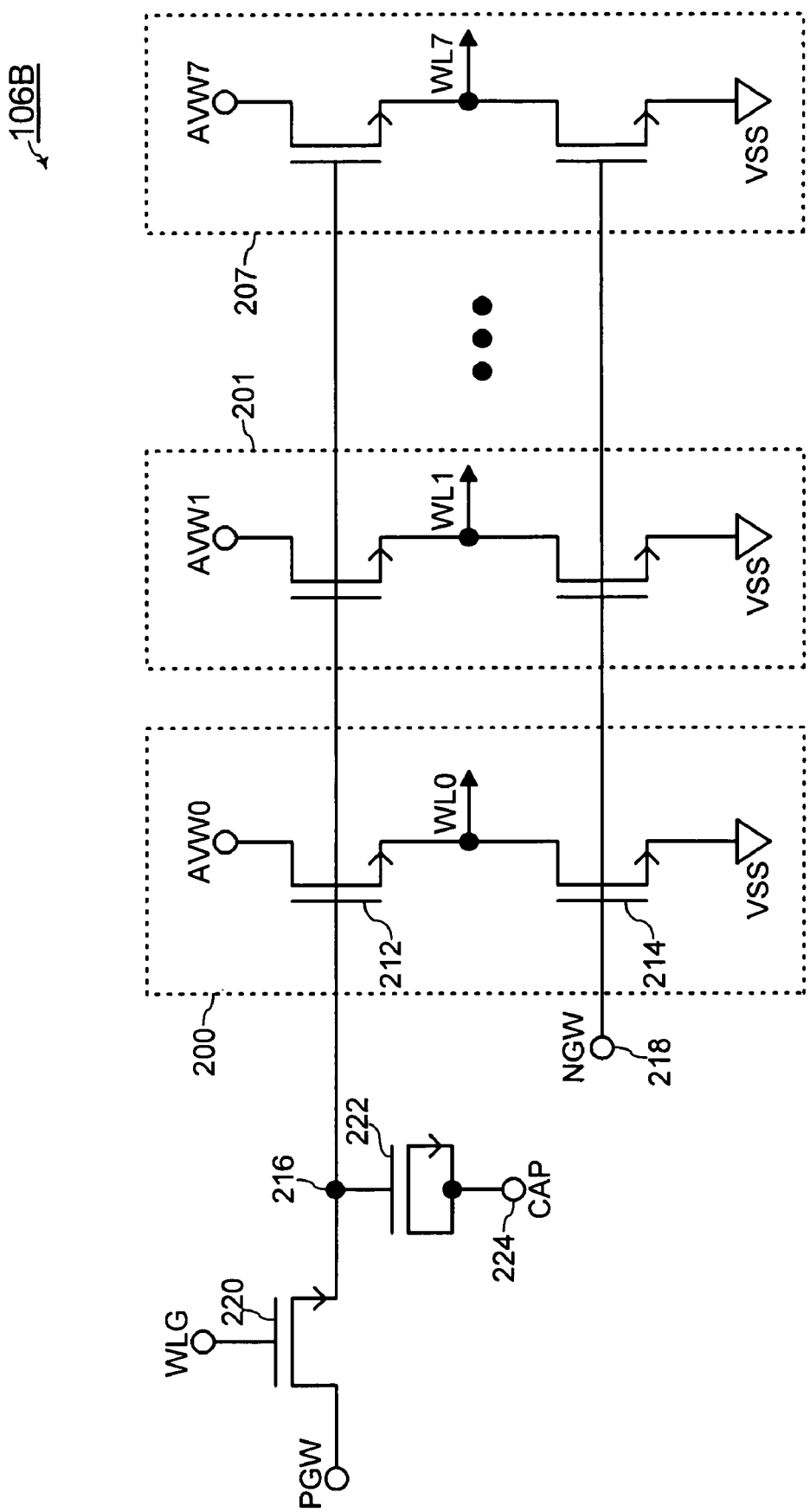
FIG. 3 shows a circuit diagram of a local X-decoder with one control MOSFET for all driving MOSFETs resulting in minimized area and wiring complexity, according to an embodiment of the present invention.

FIG. 3 shows an X-decoder 106B which may be used in a flash memory device, similarly to the local X-decoder 106 within the flash memory device 100 of FIG. 1. Referring to FIG. 3, the X-decoder 106B includes eight drivers 200, 201, . . . , and 207, each driving a respective word-line WL0, WL1, . . . , and WL7 of the flash memory device. Each driver such as the example driver 200 includes a driving MOSFET (metal oxide semiconductor field effect transistor) 212 and a pull-down MOSFET 214.

The driving MOSFET 212 has a drain with a respective line voltage AVW0 applied thereon. The driving MOSFET 212 also has a gate coupled to a common node 216 also coupling all the gates of the driving MOSFETs of the eight drivers 200, 201, . . . , and 207. The source of the driving MOSFET 212 is coupled to the drain of the pull-down MOSFET 214.

The pull-down MOSFET 214 has a source coupled to a low voltage VSS. The sources of the pull-down MOSFETs for all the eight drivers 200, 201, ..., and 207 are coupled to the low voltage VSS. The pull-down MOSFET 214 has a gate coupled to a common control terminal 218 with a NGW control signal applied thereon. The gates of the pull-down MOSFETs for all the eight drivers 200, 201, ..., and 207 are coupled to the common control terminal.

Thus, each driver 200, 201, ..., and 207 has a respective driving MOSFET with a respective line voltage AVW applied on the drain of the respective driving MOSFET for driving a respective word line WL to the line voltage AVW. The gates of the driving MOSFETs are coupled together at the common node 216.

The X-decoder 106B also includes a control MOSFET 220 having a source coupled to the common node 216. The PGW control signal is coupled to the drain of the control MOSFET 220, and the WLG control signal is coupled to the gate of the control MOSFET 220.

In addition, the X-decoder 106B includes a capacitor 222 coupled between the common node 216 and a capacitance node 224. In an example embodiment of the present invention, the capacitor 222 is comprised of a MOSFET (metal oxide semiconductor field effect transistor) having a gate coupled to the common node 216 and having a drain and a source that are coupled together at the capacitance node 224.

Figure 4:
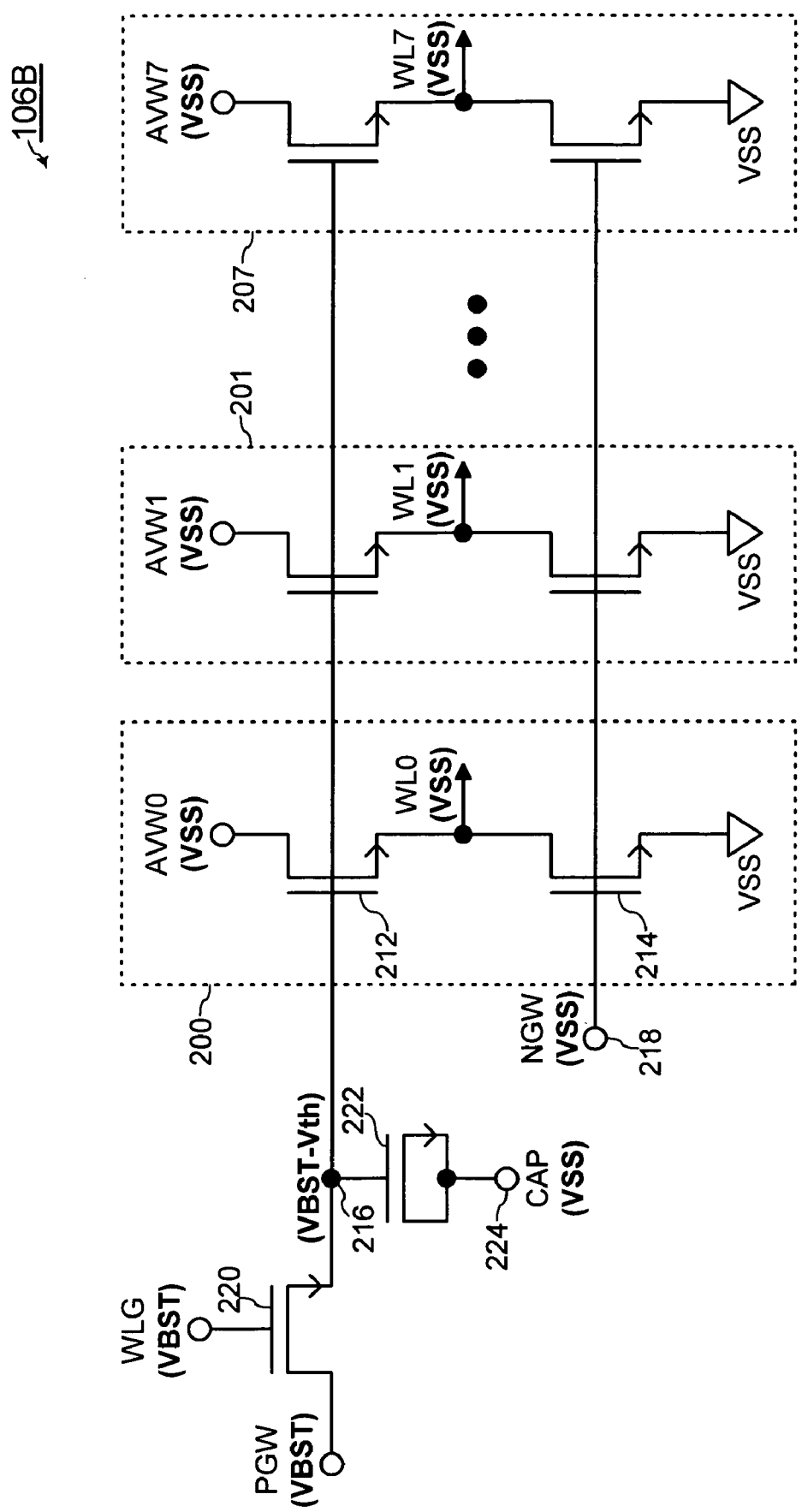
FIG. 4 shows the local X-decoder of FIG. 3 with voltages for generating an initial boost voltage at a common node, according to an embodiment of the present invention.
Figure 5:
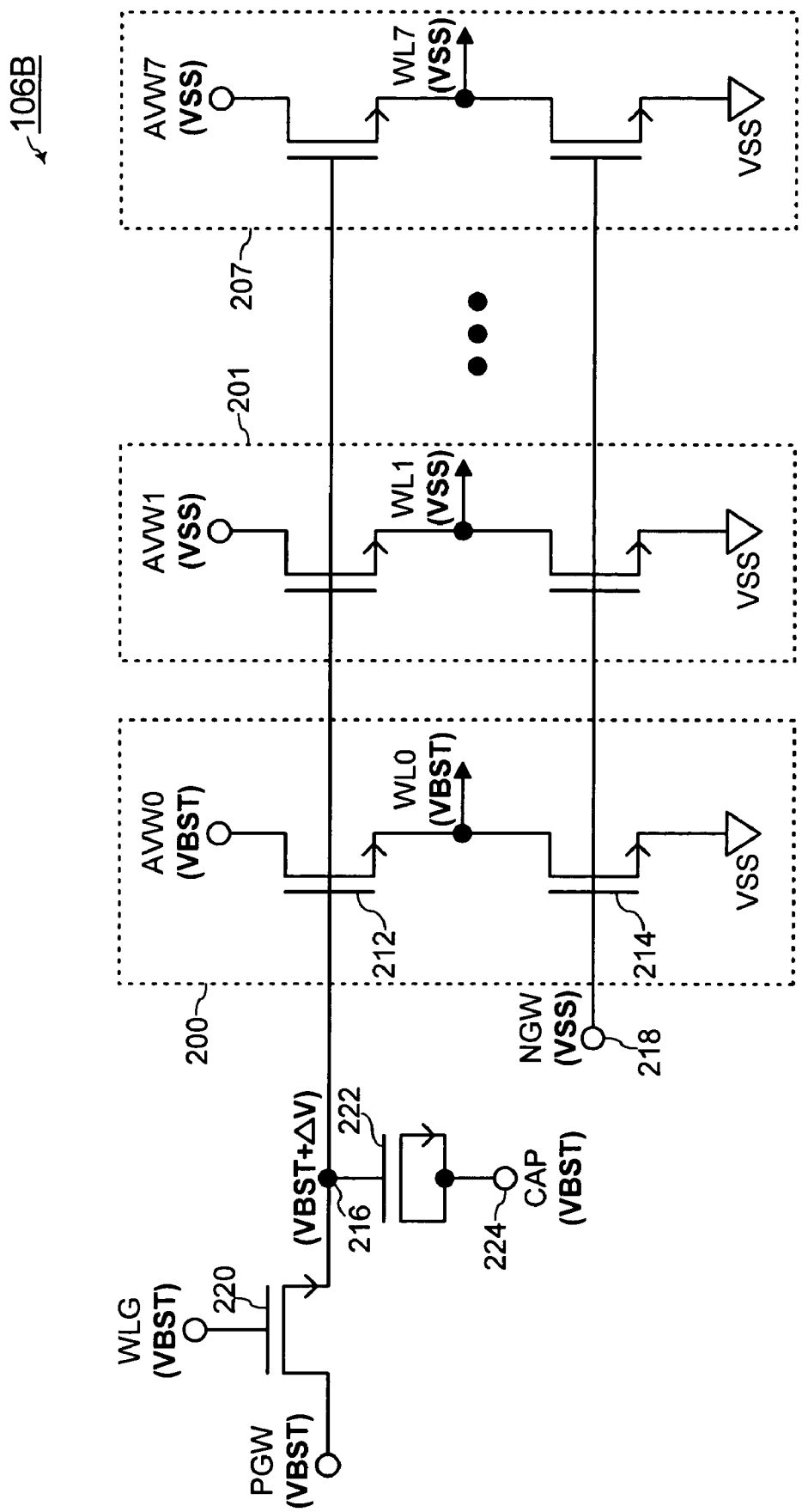
FIG. 5 shows the local X-decoder of FIG. 3 with voltages for generating a final boost voltage at the common node, according to an embodiment of the present invention.
Figure 6:
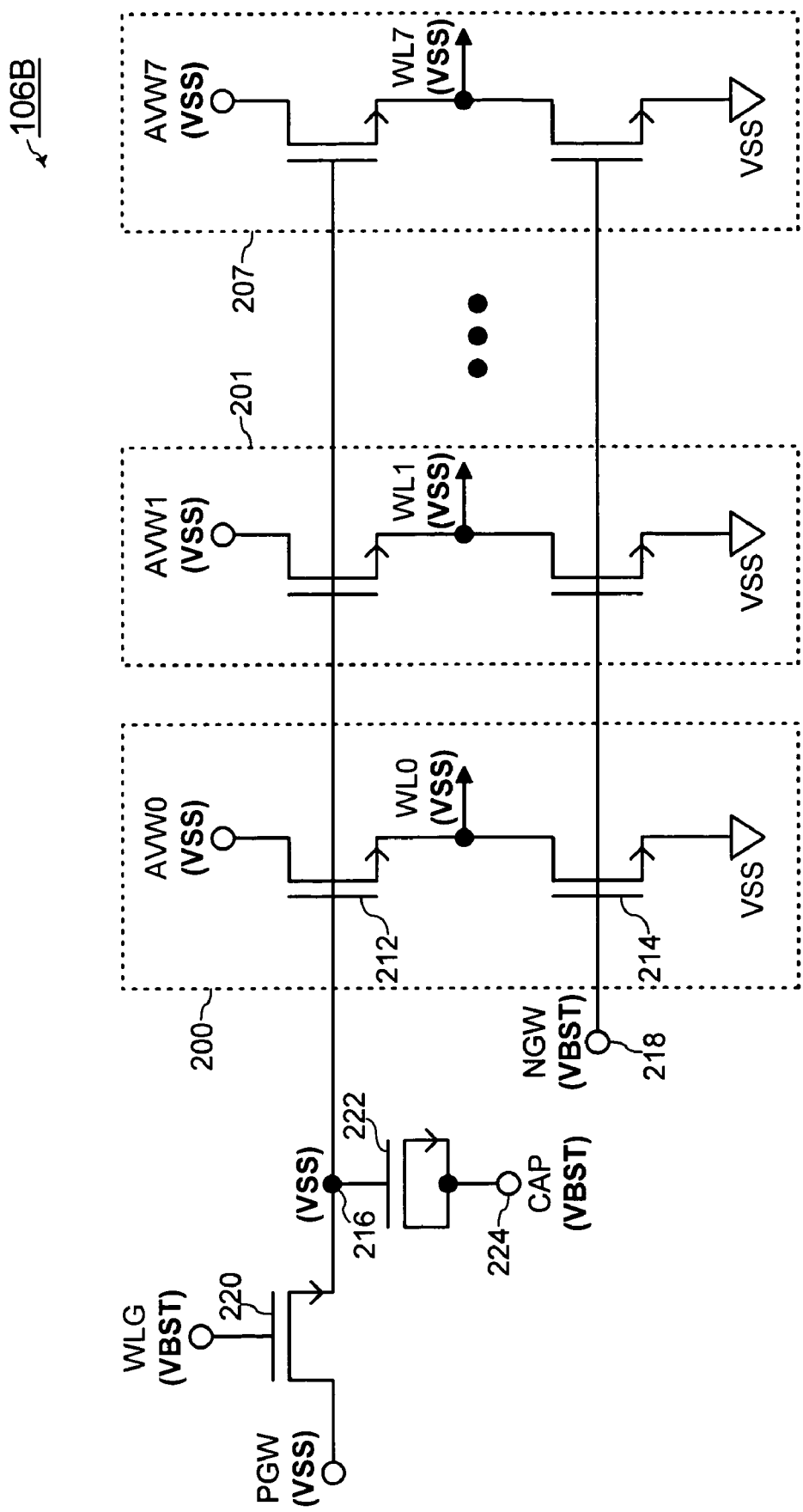
FIG. 6 shows the local X-decoder of FIG. 3 with voltages for discharging the word lines to a low voltage, according to an embodiment of the present invention.

The operation of the X-decoder 106B is now described in reference to FIGS. 4, 5, and 6. First assume that the control signals PGW and WLG are at a boost voltage VBST (while the control signal NGW is at the low voltage VSS) for driving one of the word lines WL0, WL1, ..., and WL7 to the boost voltage VBST. Referring to FIGS. 1 and 4, the control signals PGW and NGW are generated by the global X-decoder 108 of the flash memory device, and the control signal WLG is generated by the vertical block decoder 110 of the flash memory device.

The global X-decoder 108 activates the PGW control signal to the boost voltage VBST and de-activates the NGW control signal to the low voltage VSS such that the driver 106B drives one of the word lines WL0, WL1, ..., and WL7 to the boost voltage VBST. Assume for example that the first word line WL0 is to be driven to the boost voltage VBST.

Referring to FIG. 4, initially, all of the line voltages AVW0, AV1, ..., and AVW7 applied on the driving MOSFETs of the eight drivers 200, 201, ..., and 207 are set to the low voltage VSS. In addition, the low voltage VSS is applied on the capacitance node 224. With such voltages in FIG. 4, an initial boost voltage (VBST−Vth) is generated on the common node 216, with Vth being the threshold voltage of the control MOSFET 220. In addition with such voltages in FIG. 4, the low voltage VSS is generated on the word-lines WL0, WL1, ..., and WL7.

Thereafter, referring to FIG. 5, the boost voltage VBST is applied simultaneously on the capacitance node 224 and on the drain of the driving MOSFET 212 as the line voltage AVW0. Generally, the boost voltage VBST is applied on the drain of the driving MOSFET within the driver coupled to the selected one of the word lines WL0, WL1 ..., or WL7 to be driven to the boost voltage VBST.

With such voltages in FIG. 5, a final boost voltage (VBST+ΔV) is generated on the common node 216, with ΔV being at least (and substantially about) the threshold voltage of the driving MOSFET 212. Thus, the first word line WL0 is driven to the original boost voltage VBST. Since the other line voltages AVW1, ..., and AVW7 are the low voltage VSS, the other word lines WL1, ..., and WL7 are deactivated to the low voltage VSS.

Referring to FIGS. 4 and 5, the capacitor 222 stores charge from the bias voltages of FIG. 4 as the initial boost voltage (VBST−Vth) is generated on the common node 216.

Thereafter, when the boost voltage VBST is applied on the driving transistor 212 and the capacitance node 224 in FIG. 5, the final boost voltage (VBST+ΔV) is generated on the common node 216.

Such a final boost voltage (VBST+ΔV) is stepped up from the initial boost voltage (VBST−Vth). Such a final boost voltage (VBST+ΔV) is higher than the original boost voltage VBST for advantageously turning on the driving MOSFET 212 when the source of the driving MOSFET 212 is biased to the original boost voltage VBST.

Because the gates of the eight driving MOSFETs for the eight drivers 200, 201, ..., and 207 are coupled to the common node 216, the capacitor 222 is coupled to the common node 216 for maintaining the voltage at the common node 222. The capacitance of the capacitor 222 is designed to be substantially larger than the gate capacitance of each of the driving MOSFETs for the eight drivers 200, 201, ..., and 207 for preventing degradation of the voltage at the common node 216. Any of the other drivers 201, ..., and 207 operates similarly to the driver 200 to drive the respective word line WL to the boost voltage VBST when the corresponding line voltage AVW at the drain of the driving MOSFET is activated to the boost voltage VBST.

FIG. 6 illustrates the case when the PGW control signal is deactivated to the low voltage VSS and the NGW control signal is activated to the boost voltage VBST such that the eight word lines WL0, WL1, ..., and WL7 are deactivated to the low voltage VSS. In that case, the pull-down MOSFETs (such as 214) within each of the drivers 200, 201, ..., and 207 are turned on such that each of the eight word lines WL0, WL1, ..., and WL7 are coupled to the VSS voltage source. In addition, the common node 216 has the low voltage VSS generated thereon no matter the voltage applied on the capacitance node 224.

In this manner, the X-decoder 106B is implemented with just one control MOSFET 220 and the capacitor 222 that is common to all of the eight drivers 200, 201, ..., and 207. Thus, the X-decoder 106B is implemented with a minimized number of the control MOSFET 200. Furthermore, the one common node 216 is used to bias the gates of the driving MOSFETs of the eight drivers 200, 201, ..., and 207. Such a common node 216 is advantageous for minimizing wiring to the eight drivers 200, 201, ..., and 207. As a result, the eight drivers may be fabricated compactly with minimized area.

The foregoing is by way of example only and is not intended to be limiting. For example, the present invention is described for a local X-decoder within a flash memory device. However, the present invention may be used for any type of decoder within any type of memory device. In addition, any number of elements illustrated and described herein is by way of example only, and the present invention may be used for any number of such elements. The present invention is limited only as defined in the following claims and equivalents thereof.

I claim:

1. A decoder for a memory device, the decoder comprising:

a plurality of driving devices each applying a respective line voltage to a respective line of the memory device when turned on;

a control device coupled to the plurality of driving devices at a common node for generating a voltage at the common node for controlling the driving devices to turn on or off; and a capacitor, coupled to the common node, wherein a charge stored in the capacitor increases the voltage at the common node from an initial boost voltage to a final boost voltage;

and wherein the control device has substantially same constant control voltages applied thereon during generation of both the initial boost voltage and the final boost voltage at the common node.

2. The decoder of claim 1, wherein the capacitor is a MOSFET (metal oxide semiconductor field effect transistor) having a gate coupled to the common node and having a drain and a source that are coupled together at a capacitance node.

3. The decoder of claim 2, wherein a low voltage is applied on the capacitance node when the initial boost voltage is generated at the common node.

4. The decoder of claim 3, wherein each of the driving devices is a MOSFET having a gate coupled to the common node and having a drain with the respective line voltage applied thereon and having a source coupled to the respective line.

5. The decoder of claim 4, wherein the respective line voltage for each of the driving devices is the low voltage when the initial boost voltage is generated at the common node.

6. The decoder of claim 5, wherein one of the respective line voltages is an original boost voltage that is also applied on the capacitance node for generating the final boost voltage at the common node.

7. The decoder of claim 6, wherein the control device is a MOSFET having a source coupled to the common node and having a gate and a drain with the original boost voltage applied thereon during generation of the initial boost voltage and the final boost voltage on the common node.

8. The decoder of claim 1, further comprising:
a plurality of pull-down devices, each applying a low voltage to a respective line of the memory device when the driving devices are turned off.

9. The decoder of claim 8, wherein each pull-down device is a MOSFET having a source with the low voltage applied thereon, a drain coupled to a respective line, and a gate coupled to a common control terminal.

10. The decoder of claim 9, wherein the gates of all the MOSFETs comprising the pull-down devices are coupled to the common control terminal.

11. The decoder of claim 10, wherein an original boost voltage is applied on the common control terminal for turning on all the MOSFETs comprising the pull-down devices such that the low voltage is applied on each respective line.

12. The decoder of claim 1, wherein the memory device is a flash memory device, and wherein each respective line is a respective word line of the flash memory device.

13. A method for driving lines in a memory device, comprising:
turning on a plurality of driving devices to apply a respective line voltage to each of a plurality of lines of the memory device;
controlling the driving devices to turn on or off by adjusting a voltage generated at a common node coupling the plurality of driving devices;
storing charge in a capacitor coupled to the common node for increasing the voltage at the common node from an initial boost voltage to a final boost voltage; and
applying substantially same constant control voltages on the control device during generation of both the initial boost voltage and the final boost voltage at the common node.

14. The method of claim 13, wherein the capacitor is a MOSFET (metal oxide semiconductor field effect transistor) having a gate coupled to the common node and having a drain and a source that are coupled together at a capacitance node.

15. The method of claim 14, further comprising: applying a low voltage on the capacitance node when the initial boost voltage is generated at the common node.

16. The method of claim 15, wherein each of the driving devices is a MOSFET having a gate coupled to the common node and having a drain having the respective line voltage applied thereon and having a source coupled to the respective line.

17. The method of claim 16, wherein the respective line voltage for each of the driving devices is the low voltage when the initial boost voltage is generated at the common node.

18. The method of claim 17, wherein one of the respective line voltages is an original boost voltage that is also applied on the capacitance node for generating the final boost voltage at the common node.

* * * * *